United States Patent
Stein et al.

(10) Patent No.: US 7,650,322 B2
(45) Date of Patent: Jan. 19, 2010

(54) METHOD AND APPARATUS FOR MAPPING THE PRIMARY OPERATIONAL SEQUENCES OF AN ALGORITHM IN A COMPUTE UNIT HAVING AN INTERNAL RANDOM ACCESS MEMORY

(75) Inventors: Yosef Stein, Sharon, MA (US);
Hazarathaiah Malepati, Norwood, MA (US); Gregory M. Yukna, Norton, MA (US)

(73) Assignee: Analog Devices, Inc., Norwood, MA (US)

( * ) Notice: Subject to any disclaimer, the term of this patent is extended or adjusted under 35 U.S.C. 154(b) by 354 days.

(21) Appl. No.: 11/584,877

(22) Filed: Oct. 23, 2006

(65) Prior Publication Data
US 2008/0154803 A1 Jun. 26, 2008

(51) Int. Cl.
*G06F 15/00* (2006.01)
*G06F 15/18* (2006.01)
(52) U.S. Cl. ...................................... 706/62
(58) Field of Classification Search ............. 706/62
See application file for complete search history.

(56) References Cited
U.S. PATENT DOCUMENTS

| | | | | |
|---|---|---|---|---|
| 4,935,867 | A * | 6/1990 | Wang et al. | 711/217 |
| 5,440,705 | A * | 8/1995 | Wang et al. | 711/220 |
| 6,476,640 | B2 | 11/2002 | Bengio et al. | |
| 6,677,869 | B2 | 1/2004 | Horie | |
| 6,823,493 | B2 * | 11/2004 | Baker | 715/236 |
| 6,876,317 | B2 | 4/2005 | Sankaran | |
| 6,906,647 | B2 | 6/2005 | Bossen | |
| 7,197,525 | B2 * | 3/2007 | Stein et al. | 708/409 |
| 7,289,889 | B2 * | 10/2007 | Naik et al. | 701/1 |
| 7,498,960 | B2 * | 3/2009 | Wilson et al. | 341/106 |
| 7,525,459 | B2 * | 4/2009 | Stein et al. | 341/106 |
| 2004/0085233 | A1 | 5/2004 | Linzer et al. | |
| 2006/0017591 | A1 | 1/2006 | Bossen | |
| 2006/0067592 | A1 | 3/2006 | Walmsley et al. | |
| 2006/0209958 | A1 | 9/2006 | Rangam et al. | |

OTHER PUBLICATIONS

Rao et al., "Cache Conscious Indexing for Decision-Support in Main Memory", Columbia University Technical Report, CUCS-019-98, Dec. 1, 1998.

(Continued)

*Primary Examiner*—Michael B Holmes
(74) *Attorney, Agent, or Firm*—Goodwin Procter LLP (57) ABSTRACT

A method and apparatus for direct mapping in a compute unit having an internal random access memory the primary operational sequences of an algorithm to related function including storing in an internal random access memory at least one predetermined direct mapped function value for each primary operational sequence of an algorithm; holding in an input data register the address in the random access memory of at least one mapped function value for a selected primary operational sequence of the algorithm and holding in an output register the at least one mapped function value for the selected primary operational sequence of the algorithm read out of the random access memory.

27 Claims, 10 Drawing Sheets

OTHER PUBLICATIONS

Nunez et al., "High-performance Arithmetic Coding VLSI Macro for the H264 Video Compression Standard", IEEE Transactions On Consumer Electronics, vol. 51, No. 1 (Feb. 2005).
U.S. Appl. No. 11/527,001, Wilson et al., filed Sep. 26, 2005.
U.S. Appl. No. 11/258,801, Wilson et al., filed Oct. 26, 2005.

International Search Report for PCT Application No. PCT/US2007/020971, mailed Apr. 15, 2008, 1 page.
Written Opinion for PCT Application No. PCT/US2007/020971, mailed Apr. 15, 2008, 5 pages.

* cited by examiner

METHOD AND APPARATUS FOR MAPPING THE PRIMARY OPERATIONAL SEQUENCES OF AN ALGORITHM IN A COMPUTE UNIT HAVING AN INTERNAL RANDOM ACCESS MEMORY

RELATED APPLICATIONS

This application is related to U.S. patent application Ser. No. 11/527,001 filed Sep. 26, 2006, entitled ITERATIVE PROCESS WITH ROTATED ARCHITECTURE FOR REDUCED PIPELINE DEPENDENCY, by Wilson et al. and U.S. patent application Ser. No. 11/258,801, filed, Oct. 26, 2005, entitled PIPELINED DIGITAL SIGNAL PROCESSOR, by Wilson et al. which are incorporated herein in their entirety by this reference.

FIELD OF THE INVENTION

This invention relates to a method of mapping the primary operational sequence or sequences of an algorithm to an internal look-up table in a compute unit.

BACKGROUND OF THE INVENTION

In a pipelined machine if an instruction is dependent on the result of another one, a pipeline stall will happen where the pipeline will stop, waiting for the offending instruction to finish before resuming work. This is especially a problem in iterative arithmetic coding processes such as JPEG2000, JPEG, On2, and in H.264 Context-based Adaptive Binary Arithmetic Coding (CABAC). For example H.264 CABAC is based on the principle of recursive interval subdivision. [For a full description of the H264 CABAC standards and details see ITU-T Series H: Audiovisual and Multimedia Systems Infrastructure of audiovisual—coding of moving video] Given a probability estimation $p(0)$ and $p(1)=1-p(0)$ of a binary decision (0,1), an initially given interval or range will be subdivided into two sub-intervals having a range$*p(0)$ and range-range$*p(0)$, respectively. Depending on the decision, the corresponding sub-interval will be chosen as the new code interval, and a binary code string pointing to that interval will present the sequence of binary decisions. It is useful to distinguish between the most probable symbol (MPS) and the least probable symbol (LPS), so that binary decisions are identified as either MPS or LPS, rather then 0 or 1. According to H.264 CABAC process the range and state are used to access a two dimensional look-up table to determine the rLPS (range of least probable symbol). Current range is derived from the rLPS and the previous range. If the code offset (Value) is less than the current range, the Most probable path is taken where the most probable symbol (MPS) is designated as the next output bit, and the state transition is preformed based on the most probable symbol (MPS) look-up table. If Value is greater than current range, the Least probable path is taken where the MPS bit is inverted, the current Value is determined from the previous Value and the range then rLPS is assigned to range. Following this, if the state equals zero, the MPS is inverted. The next state transition is derived from the LPS state table based on the current state, followed by the renormalization process where the range is then renormalized to the [511,256] interval. This is done by left-shifting range the required amount of bits. Value must be left shifted the same amount of bits. Value bits that are shifted out constitute the output of the arithmetic coder. The problem with the normalization procedure is that some times a carry bit is produced during the Value updating. This carry bit can propagate to parts of the code that have been already issued. Thus, the outstanding bits mechanism is implemented so that output bit is suspended until it is clear that future carry bits will not propagate to already-emitted parts of the code. Basically, any bit with a value '0' will stop the carry propagation. The aforesaid routines and algorithms, as well as many others require a great deal of computation and are vulnerable to pipeline stall. Yet in this and many other algorithms, there are preferred paths or most probable solutions or primary operational sequences of operation which require numerous cycles of operation to accomplish yet whose output is fairly predictable.

BRIEF SUMMARY OF THE INVENTION

It is therefore an object of this invention to provide an improved method and apparatus for mapping the primary operational sequence(s) of an algorithm to an internal compute unit Random Access Memory look-up table.

It is a further object of this invention to provide such an improved method and apparatus for mapping the primary operational sequence(s) of an algorithm to an internal compute unit Random Access Memory look-up table which has improved efficiency and performance especially in pipelined machines.

It is a further object of this invention to provide such an improved method and apparatus for mapping the primary operational sequence(s) of an algorithm to an internal compute unit Random Access Memory look-up table which requires less power.

It is a further object of this invention to provide such an improved method and apparatus for mapping the primary operational sequence(s) of an algorithm to an internal compute unit look-up table which allows reuse of the look-up table for different algorithms.

It is a further object of this invention to provide such an improved method and apparatus for mapping the primary operational sequence(s) of an algorithm to an internal compute unit Random Access Memory look-up table which increases system flexibility and enables "soft" solutions, i.e., without dedicated hardware.

The invention results from the realization that an improved, faster, more efficient method and apparatus for performing an algorithm can be achieved, with a compute unit having an internal random access memory, by providing in the random access memory a look-up table for storing at least one predetermined direct mapped function value for each primary operational sequence of an algorithm (e.g. H.264 CABAC encoder normalization), addressing from an input data register at least one mapped function value for the selected primary operational sequence of the algorithm and holding the at least one mapped functional value read out of the random access memory look-up table.

The subject invention, however, in other embodiments, need not achieve all these objectives and the claims hereof should not be limited to structures or methods capable of achieving these objectives.

This invention features in a compute unit having an internal random access memory, for providing within the compute unit direct mapping of the primary operational sequences of an algorithm to related function including storing in an internal random access memory at least one predetermined mapped function value for each primary operational sequence of an algorithm and holding in an input data register the address in the random access memory of at least one mapped function value for a selected primary operational sequence of the algorithm. An output register holds the at least one mapped function value for the selected primary operational sequence of the algorithm read out of the random access memory.

The invention also features a compute unit having an internal random access memory for mapping the primary operational sequences of an algorithm. There is an internal random access memory for storing at least one predetermined direct mapped function value for each primary operational sequence of an algorithm. There is an input data register for holding the address in the random access memory of at least one mapped function value for a selected primary operational sequence of the algorithm and an output register for holding the at least one mapped function value for the selected primary operational sequence of the algorithm read out of the random access memory.

In a preferred embodiment the algorithm may include an H.264 CABAC encode normalization process. The input data register may be one of the compute unit register file. The output register may be one of the compute unit register file. The input data register may have a range number of normalization bits field, number of outstanding bits field, and value MSB bit field. The output register may have a value MSP bit field, new outstanding bit field, number of bits to write to FIFO field and value of bits to write to FIFO field. The output data register may include a plurality of fields. The random access memory may include a value MSB function, number of outstanding bits, number of bits to write to FIFO, and the bit stream sequence. The succession of addresses in the input data register may not be dependent on each other. The random access memory may include a look-up table. The algorithm may include H.264 CABAC decode process. The random access memory look up table may include an rLPS, MPS State and a valid flag mapping functions. The input data register may include a state, range and value fields. The output register may include an rLPs, MPS-State and a valid field.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
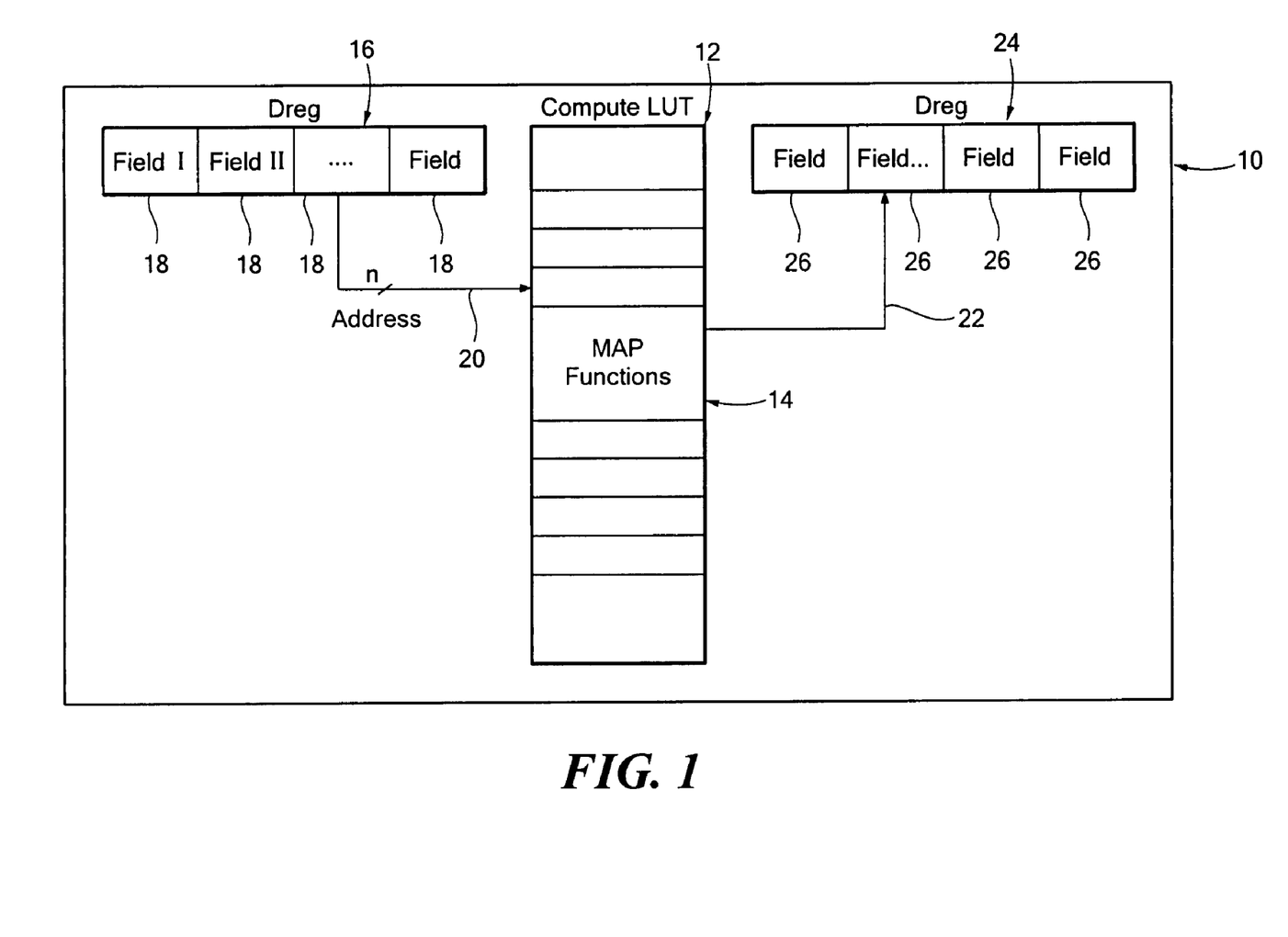
FIG. 1 is a schematic block diagram of a compute unit configured to implement the method and apparatus of this invention.

There is shown in FIG. 1. a portion of the compute unit 10 including an internal random access memory 12 which includes a look-up table 14 of mapped function values for each primary operational sequence of an algorithm. There is an input data register 16 which includes a number of fields 18 which provide an address on line 20 to preselected map functions in look-up table 14 of random access memory 12. The one or more map functions are read out on line 22 to output register 24 which itself contains a number of fields 26.

Figure 2:
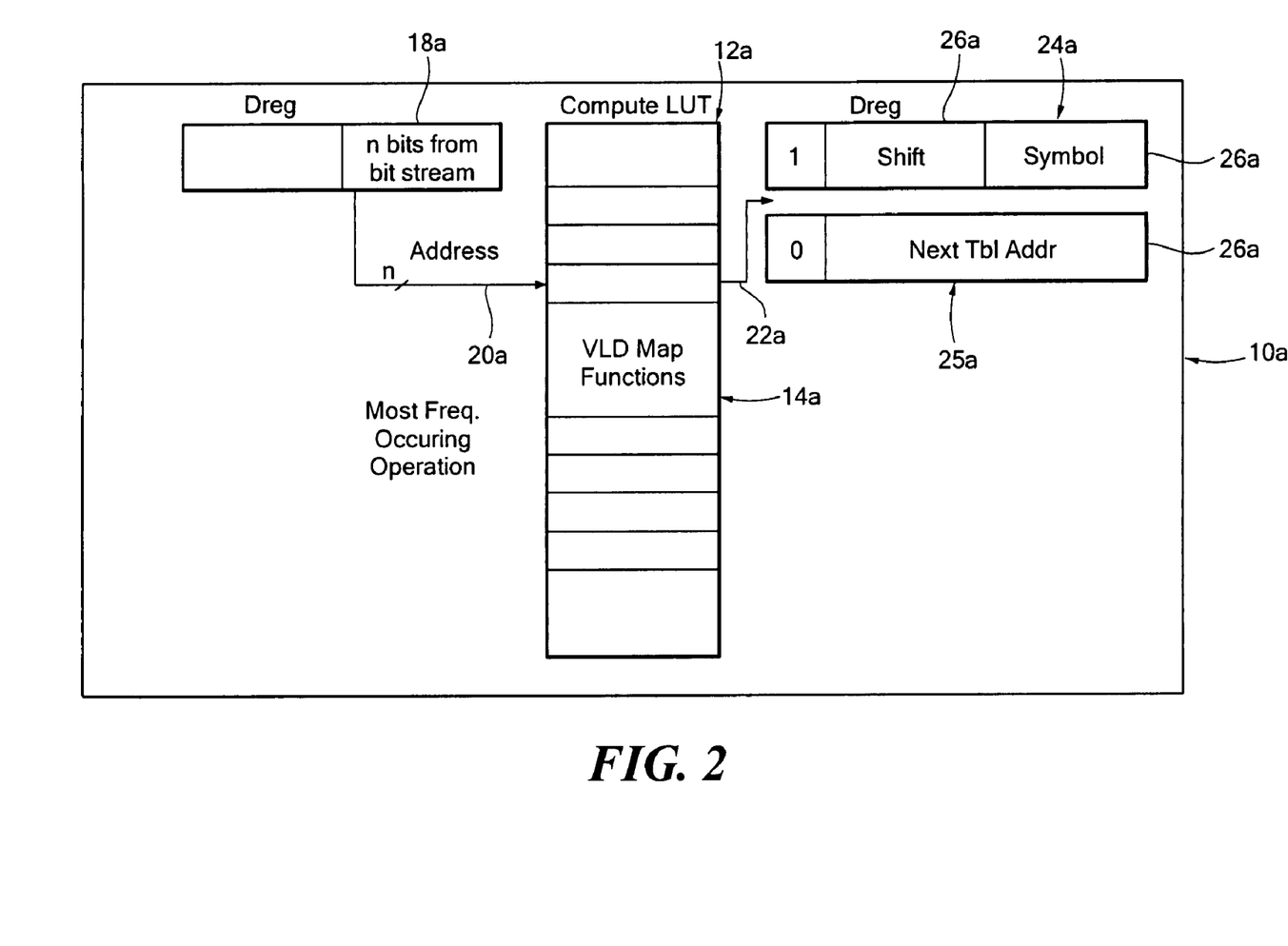
FIG. 2 is a schematic block diagram of a compute unit configured to perform variable length decoding according to the method and apparatus of this invention.
Figure 3:
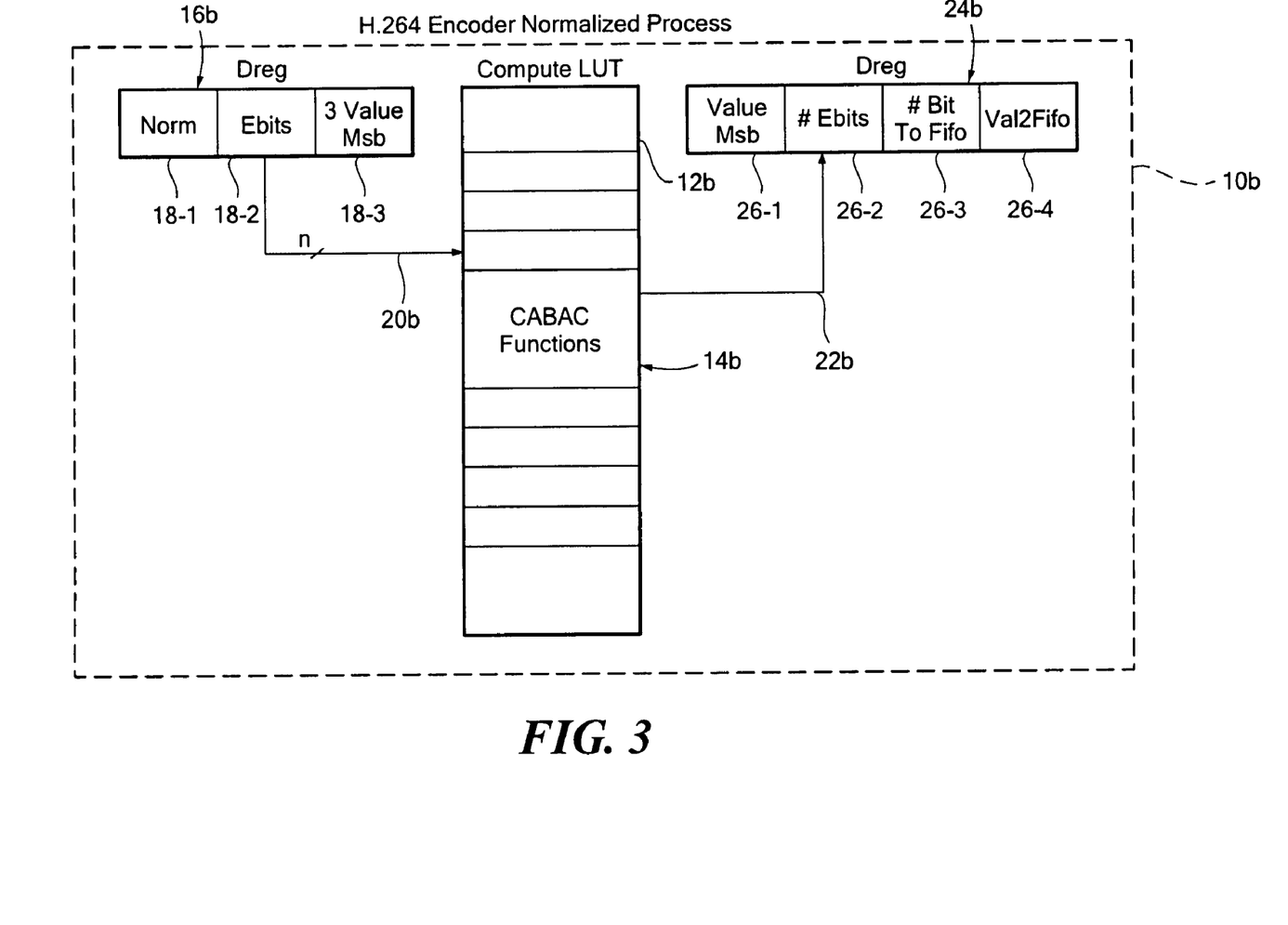
FIG. 3 is a schematic block diagram of a compute unit configured to perform H.264 CABAC encoder normalization according to the method and apparatus of this invention.

The invention may be used in a Variable Length Decoding (VLD) application, FIG. 2, where the field providing the address 18a comprises n bits from the bit stream which are delivered over line 20a to the variable length decoding map functions in look-up table 14a of random access memory 12a. These functions stored in look-up table 14a are the most frequently occurring operations in the variable length decoding algorithm. The output on line 22a read out from the look-up table 14a. may be one of the following options if in the ninputbits a symbol was present, the output register will take the form of 24a, where the MSB is set to '1' to mark a symbol present, a shift field that defines how much to advance the bit stream pointer and the actual symbol field. Otherwise, if the VLD symbol is longer then n, the output register will take the form of 25a, where the MSB is '0' to mark a fraction of a symbol and the other field is a pointer to the beginning of the next parsing table address In another embodiment, FIG. 3, the primary operational sequence or the most frequently occurring operations is directed to an H.264 CABAC encoded normalization process. In that case, input register 16b includes three fields, the 2 LSB of normalization value field (the amount of left shifting required to put range in the [511,256] interval) 18-1, the 2 LSB of ebits bits field (the number of suspended (outstanding) bits) 18-2, and a 3 value most significant bit field 18-3. In this embodiment the compute unit random access memory 12b holds in its look-up 14b the traditional CABAC encode mapping functions and the output register 24b includes four fields, 26-1 which contains the MSB of value, 26-2 which contains the new or updated number of outstanding ebits, 26-3 which contains the number of bits to write to the bit stream FIFO, and 26-4 which contains the values of the bit stream to be written to the FIFO.

Figure 4:
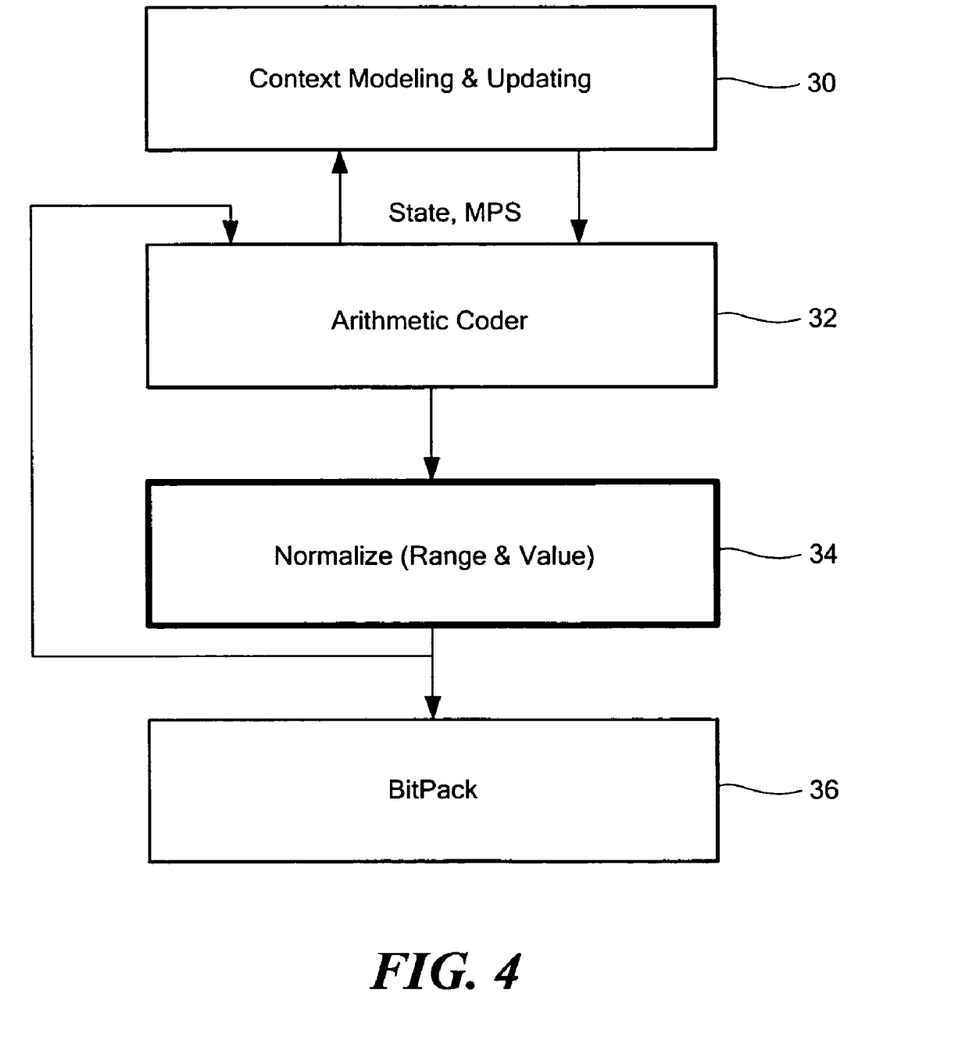
FIG. 4 is a schematic block diagram of an encoder portion of the H.264 CABAC algorithm.

In a typical H.264 CABAC encoder there is context modeling and updating 30, FIG. 4, followed by the arithmetic decoder 32 after which the range is left-shifted or renormalized to the [511,256] interval. Value 34 must be left shifted the same amount of bits. Value bits that are shifted out constitute the output of the arithmetic coder, which then provide the bit stream to the bit packer 36. Some times a carry bit is produced during the Value updating. This carry bit can propagate to parts of the code that have been already issued. Thus, the normalization process has a mechanism that can suspend an output bit or bits (outstanding bits) form being written to the bit stream FIFO until it is clear that future carry bits will not propagate to already-emitted parts of the code. Further explanation of the CABAC protocols in operation is contained in U.S. patent application Ser. No. 11/527,001 filed Sep. 26, 2006, entitled ITERATIVE PROCESS WITH ROTATED ARCHITECTURE FOR REDUCED PIPELINE DEPENDENCY, by Wilson et al. herein incorporated in its entirety by this reference.

Figure 5:
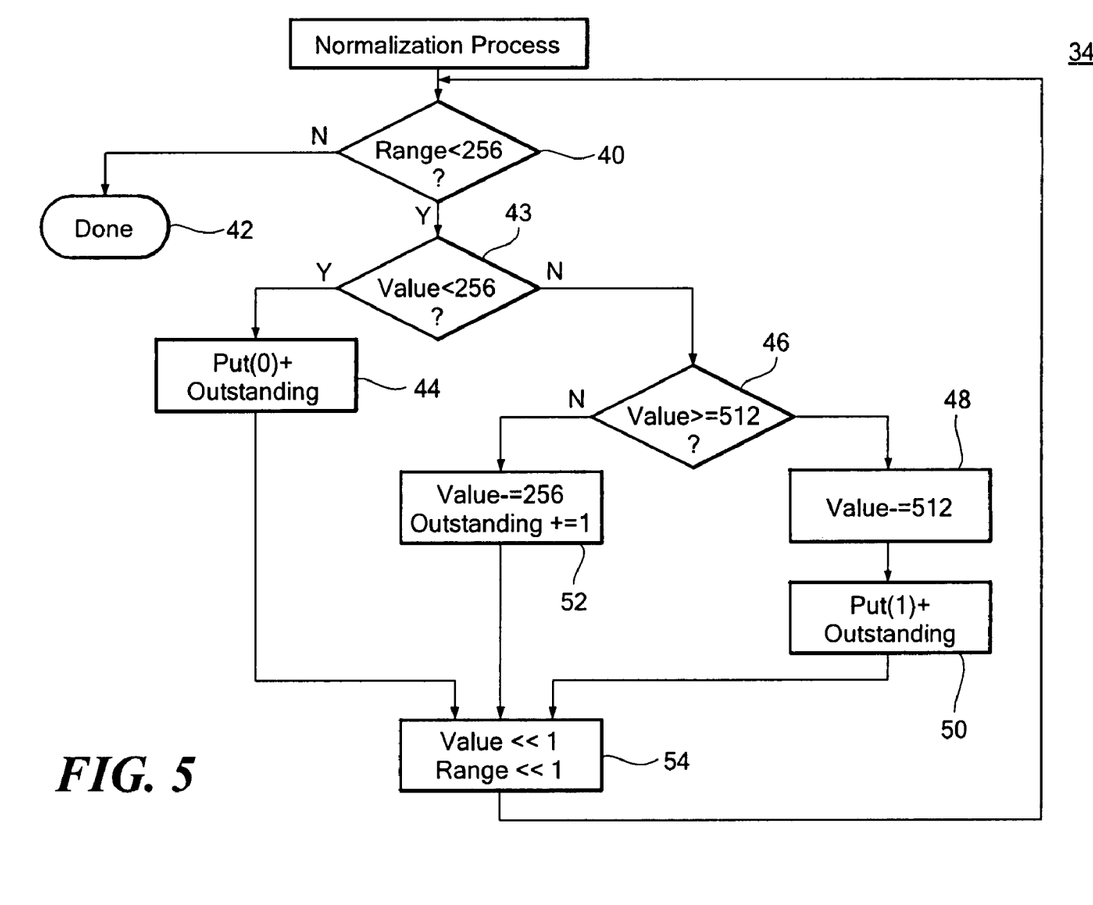
FIG. 5 is a flow chart of the normalization process of FIG. 4.

The normalization process is shown in greater detail in FIG. 5, where first the inquiry is made as to whether the range is less than 256, 40. If the answer is no, the routine is done 42. However, if the answer is yes, the range is less than 256 and the next inquiry is whether the value is less than 256, 43. If it is, then a zero followed by outstanding bits of ones are written out to the bit stream FIFO, and outstanding bits counter is reset to zero 44; if it is not, further inquiry is made as to whether it is greater than 512, 46. If it is greater than 512, then 512 is subtracted from the value 48 and a one followed by outstanding bits of zeros are written out to the bit stream FIFO, and outstanding counter is reset to zero 50. If the value is not greater than 512, that is, it is between 256 and 512 then the value is reduced by 256 and the outstanding counter is incremented by one, 52 which suspends this output bits (outstanding) form being written to the bit stream FIFO until it is clear that future carry bits will not propagate to already-emitted parts of the code. All in keeping with the h.264 CABAC encode protocols. Finally the value and range are shifted left once 54 effecting a multiply by two operation.

Figure 6:
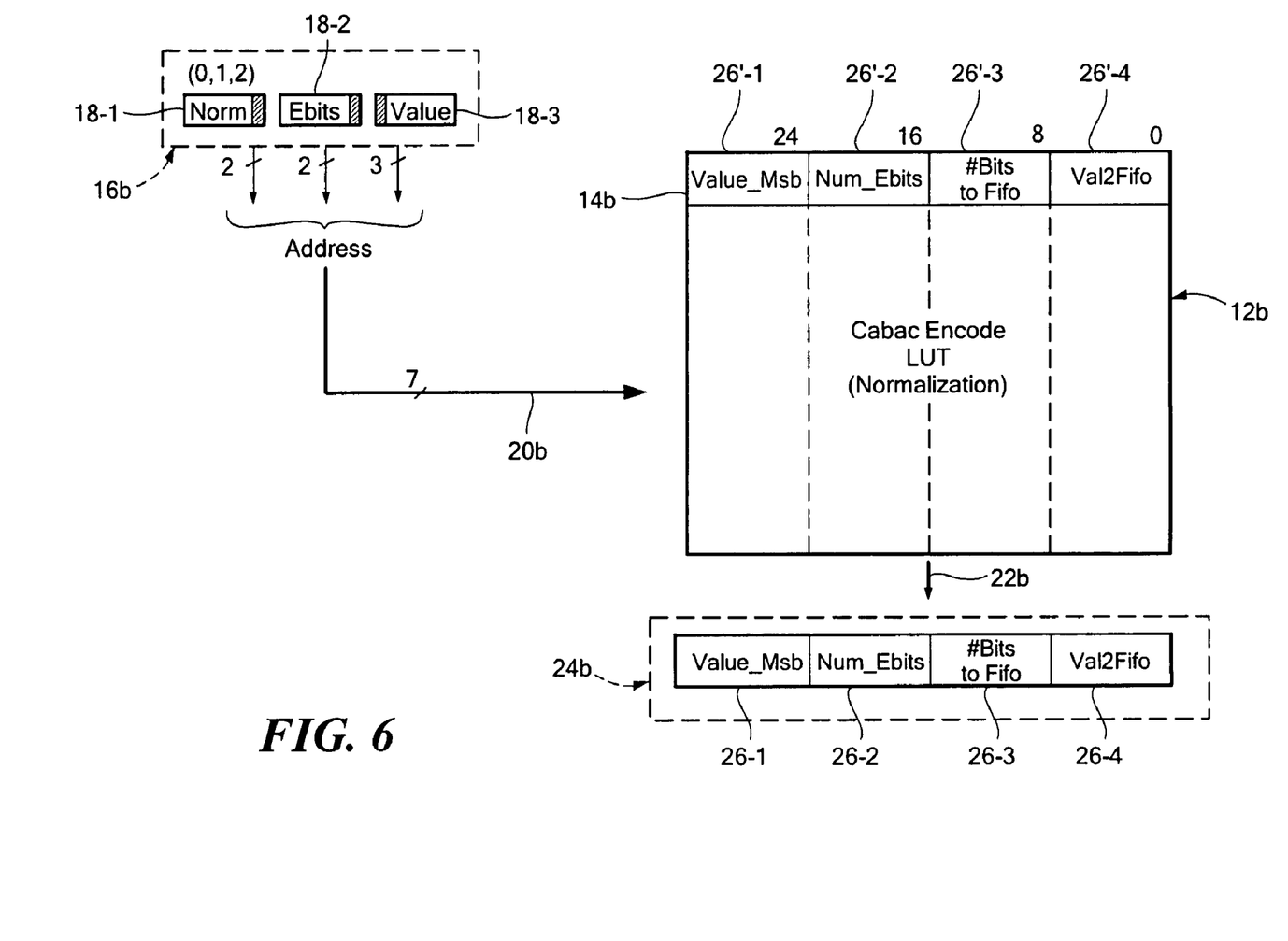
FIG. 6 is an illustration of the operation of the input data register, look-up table and output register implementing the H.264 CABAC encoder normalization process by mapping the primary operational sequences of that algorithm according to the method and apparatus of this invention.

In accordance with this invention, FIG. 6, the data register inputs: normalization two LSB 18-1, outstanding two LSB ebits 18-2, and three MSB of value 18-3 are combined together to delivered on line 20b as an address to random access memory 12b to access the values in look-up table 14b corresponding to that address which map that input directly to the output. The addressed field value MSB 26'-1, number of ebits 26'-2, number of bits to write to FIFO 26'-3 and the value or bit stream to write to FIFO 26'-4 are read out where they appear in data register in fields 26-1, 26-2, 26-3, 26-4. By using this direct mapping method the final result is obtained much more quickly and efficiently as can be seen by comparing the flow chart in FIG. 5 with that in FIG. 7.

Figure 7:
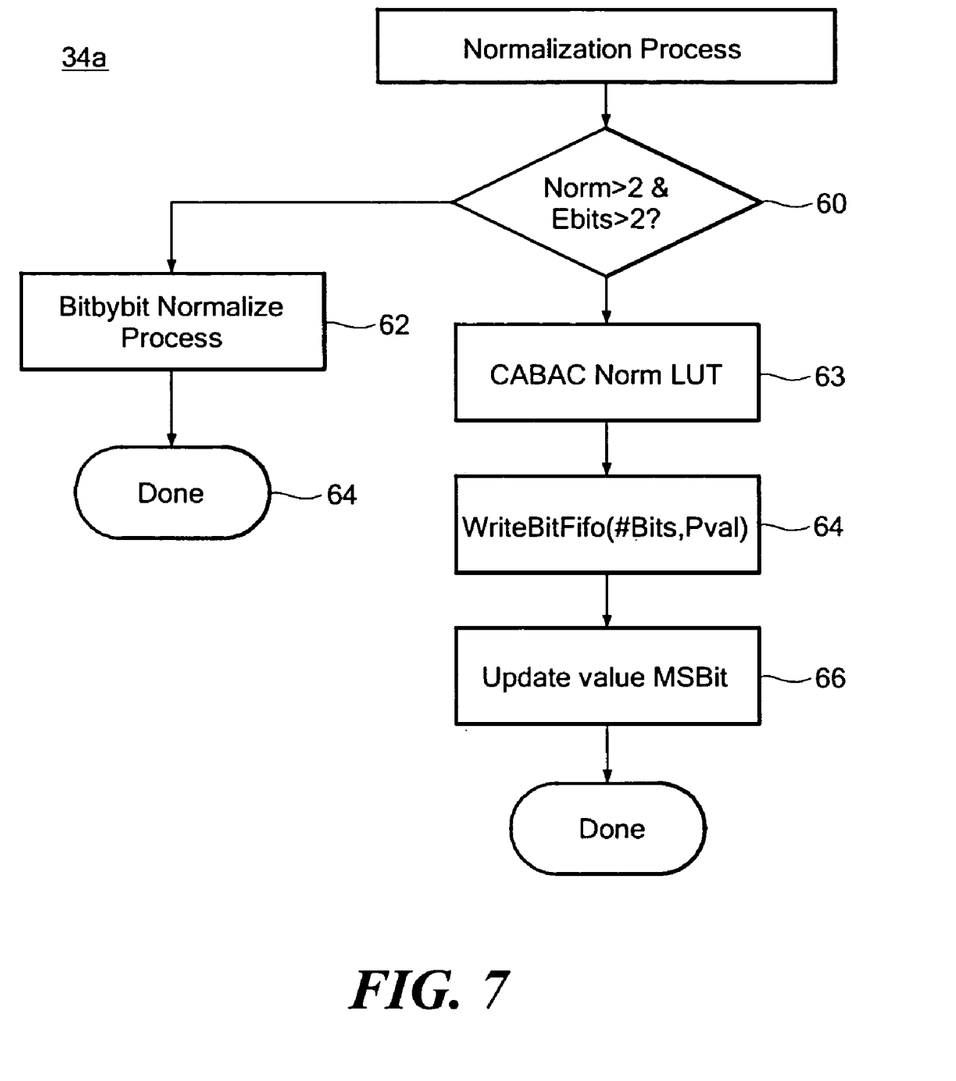
FIG. 7 is a flow chart of the H.264 CABAC encoder normalization process carried out by mapping the primary operational sequences of the algorithm according to the method and apparatus of this invention.

In this normalization process 34a, FIG. 7, accomplished by mapping the primary operational sequences or most probable solutions or preferred paths, the flow chart of FIG. 5 can be shortcut so that it takes the form of normalization process 34a, FIG. 7. There an inquiry is made as to whether the two LSB of the normalization value is greater than 2 and the number of outstanding bits (ebits) is greater than 2. If the answer is yes, the bit by bit normalization process 34 FIG. 5 is preformed 62 and the routine is done 64. If they are not greater than two then the CABAC normalization look-up table method 63 is used and the particular combination of normalization ebits and value MSBs are used to access the information in the LUT. This again renders the write bit stream FIFO the length of the code to be written and the code value 64 then the value is updated according to the value MSB field retuned from the LUT 66 after which the operation is complete in far fewer steps then previously as indicated in FIG. 5.

Figure 8:
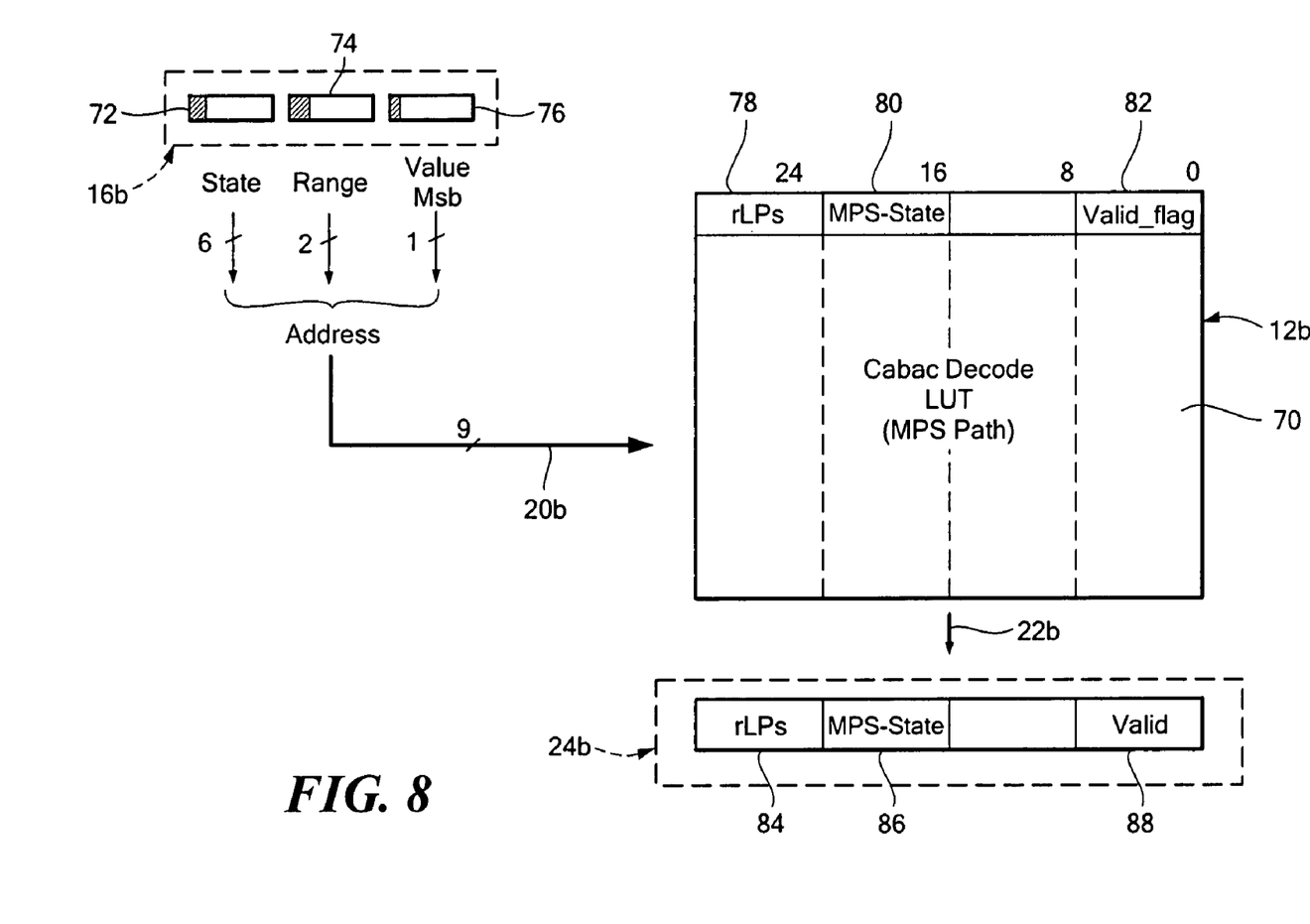
FIG. 8 is a view similar to FIG. 6 for CABAC decode.

In another embodiment, CABAC decode can be implemented, FIG. 8, using random access memory 12b with the CABAC decode look-up table which now contains the CABAC look-up table 70. Now the fields in input data register 16b are state 72, range 74 and value 76 that combine to form an address which on line 20b accesses the proper map direct to the solution representing the direct solution containing the rLPS fields 78, the (Most Probable Symbol) MPS-State field 80, and the valid flag 82 which are deposited in the proper fields 84, 86 and 88, respectively of output register 24b.

A determination is made of what particular values to store in the look-up table of the random access memory. The greater the number of values stored in the look-up table in the random access memory, the faster the system can operate and the less vulnerable it is to pipeline stall. However, the more values stored in the random access memory the larger it has to be and the more expensive and more usurptive of space on the chip it becomes. The optimum preferred path or most probable solutions or primary operational sequences that are to be shortcutted through the direct mapping technique is determined by considering the probability of occurrence of the number of outstanding bits, FIG. 9, and the number of normalization bits, FIG. 10.

Figure 9:
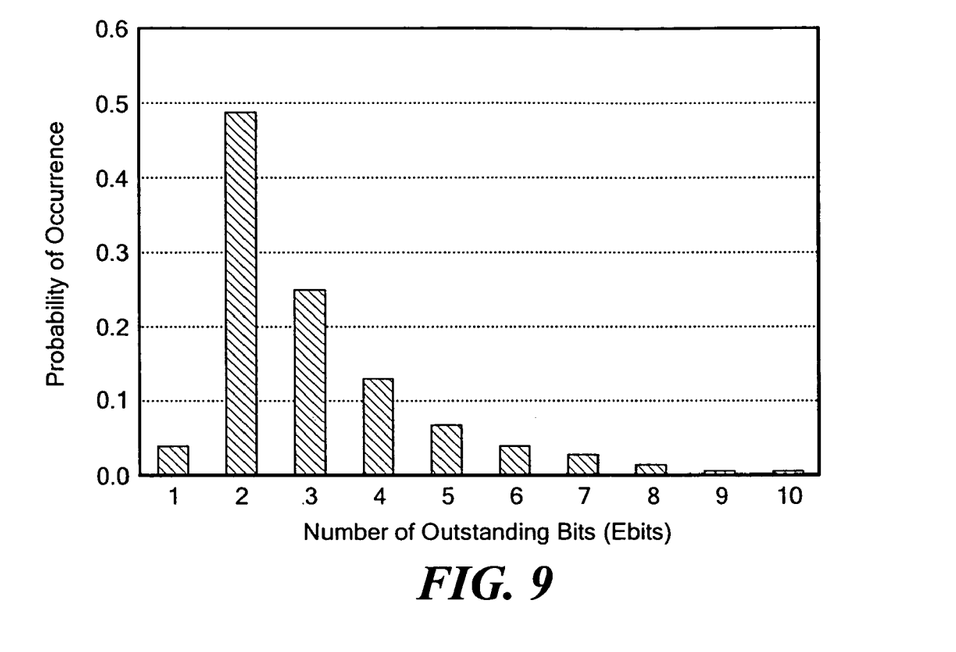
FIGS. 9 and 10 are graphical representations of the probability of occurrence of the number of outstanding bits and number of normalization bits, respectively, in an H.264 CABAC encode normalization process.
Figure 10:
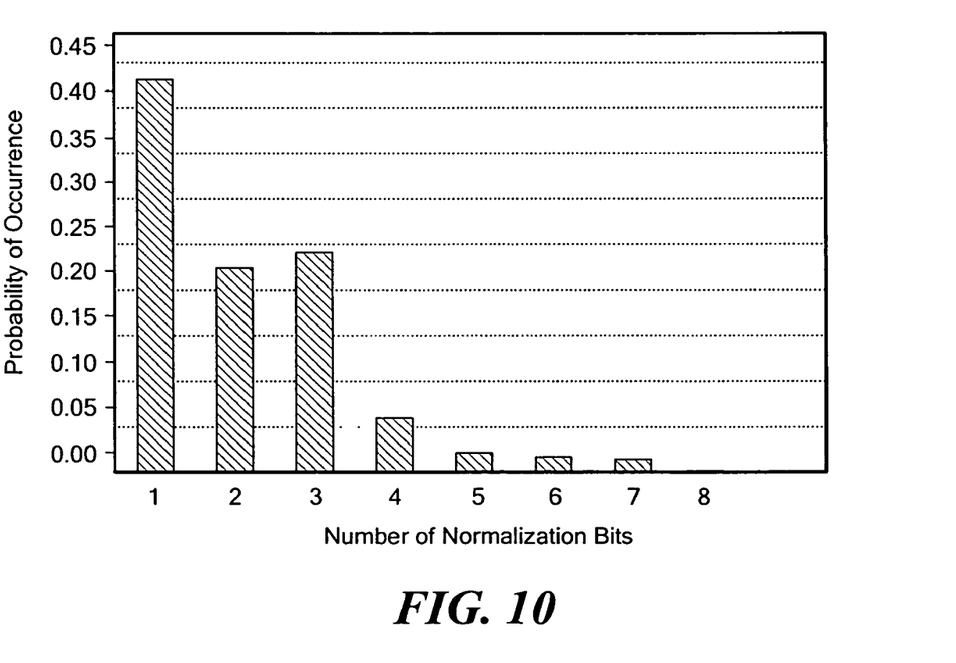

In FIG. 9 it can be seen that the number of outstanding bits or ebits, that is the number of undetermined bits per one determined bit is highest at two and fairly high at three and four by just dealing with the first two conditions, one and two in FIG. 9. The size and cost of the internal random access memory contained on the compute unit and the increased speed and decreased vulnerability to pipeline stall can be balanced. The number of normalization bits or number of shifts to normalize, FIG. 10, can be seen as highest at one and decreasing to zero at eight, a consequence of the fact that there are only eight bits to consider. Thus, again by concentrating the primary operational sequence based on the first two in FIG. 10 results in the best balance between size and cost of compute unit internal random access memory and pipeline stall vulnerability. Further discussion of the probability considerations is contained in U.S. patent application Ser. No. 11/258,801, filed, Oct. 26, 2005, entitled PIPELINED DIGITAL SIGNAL PROCESSOR, by Wilson et al. which is incorporated herein in its entirety by this reference.

Figure 11:
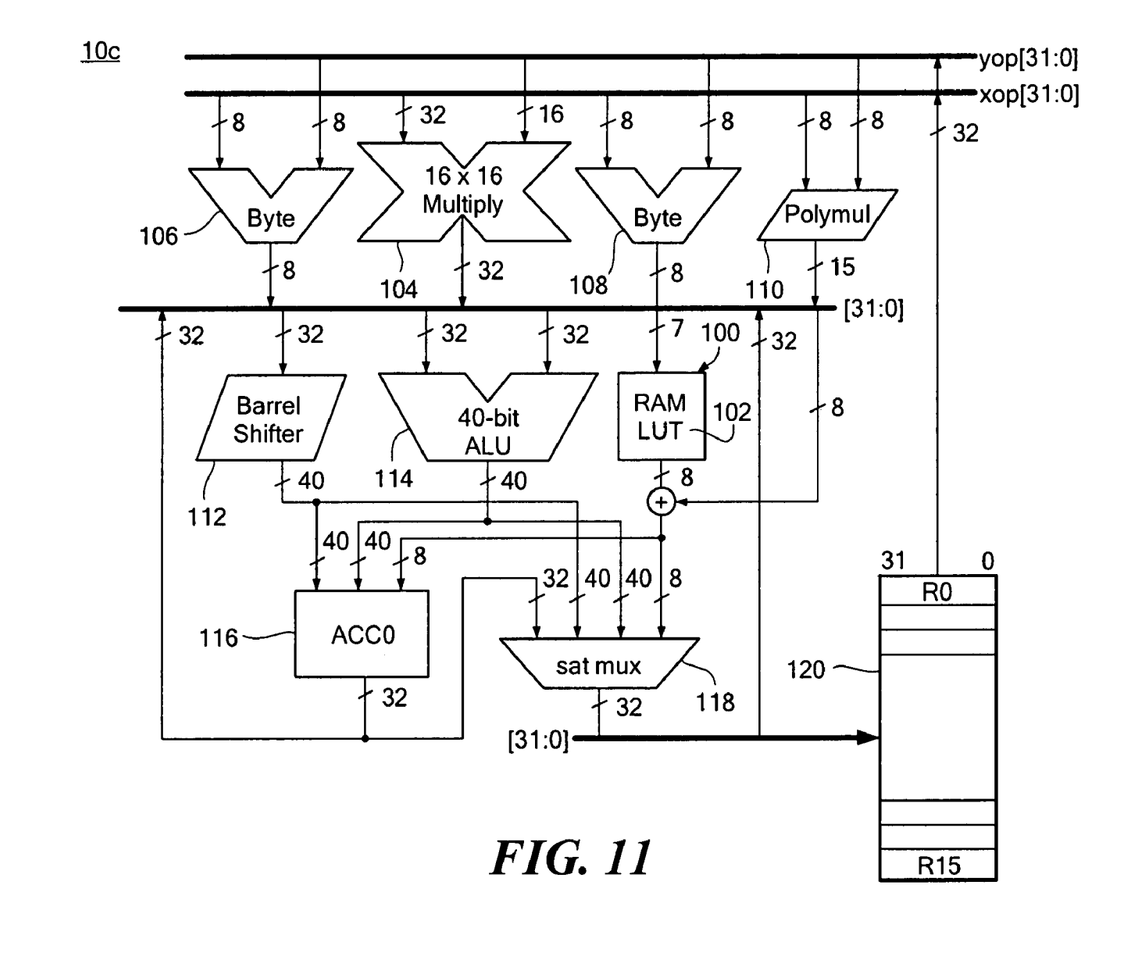
FIG. 11 is a schematic block diagram of a compute with internal random access memory look-up table configured to implement the method and apparatus of this invention.

Each compute unit 10c, FIG. 11 is provided with a local internal random access memory 100 containing a lookup table (LUT) 102. Compute unit 10c typically may include multiplier 104, a number of select circuits 106 and 108, a polynomial multiplier 110, such as for Galois field operations, barrel shifter 112, arithmetic logic unit 114, accumulator 116, and mux 118 among other things. Also, each compute unit includes a register file 120. Typically when there is more than one compute unit, they may all share the same register file 120. Each compute unit also has its own local internal random access memory containing a LUT. These local internal random access memory arrays are small enough to fit in conventional compute units and to be accessible in one cycle, yet they are large enough to support most applications internally of the compute unit without having to go to external memory and bringing about pipeline stall.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A compute unit having an internal random access memory and at least one register file for providing accelerated handling of an algorithm, the compute unit comprising:
   an internal random access memory for storing at least one predetermined mapped function value for each of the most frequently occurring operations of an algorithm;
   an input data register for holding the address in said random access memory of at least one mapped function value for a selected operation of the most frequently occurring operations of the algorithm; and
   an output register for holding the at least one mapped function value for the selected operation of the most frequently occurring operations of the algorithm read out of said random access memory.

2. The compute unit of claim 1 in which said algorithm is the H.264 CABAC encode normalization process.

3. The compute unit of claim 1 in which said input data register is a compute unit register file.

4. The compute unit of claim 1 in which said output data register is a compute unit register file.

5. The compute unit of claim 2 in which said input data register comprises a range number of normalization bits field, a number of outstanding bits field and a value MSB bits field.

6. The compute unit of claim 2 in which said output register comprises a value MSB bit field, a new outstanding bits field, a number of bits to write to FIFO field and the value of bits to write to FIFO field.

7. The compute unit of claim 1 in which said input data register includes a plurality of fields.

8. The compute unit of claim 1 in which said output data register includes a plurality of fields.

9. The compute unit of claim 2 in which said random access memory look up table includes a value MSB function, a number of outstanding bits, a number of bits to write to FIFO, and the bit stream sequence.

10. The compute unit of claim 1 in which successive addresses in said input data register are not dependent on each other.

11. The compute unit of claim 1 in which said random access memory includes a look up table.

12. The compute unit of claim 1 in which said algorithm is the H.264 CABAC decode process.

13. The compute unit of claim 12 in which said random access memory look up table includes a rLPS, an MPS State and a valid flag mapping functions.

14. The compute unit of claim 12 in which said input data register has a state, a range and value fields.

15. The compute unit of claim 12 in which said output register has an rLPs, MPS-State and a valid field.

16. In a compute unit having an internal random access memory and at least one register file, a method for providing accelerated handling of an algorithm, the method comprising:
   storing in an internal random access memory at least a predetermined mapped function value for each of the most frequently occurring operations of an algorithm;
   holding in an input data register the address in said random access memory of at least one mapped function value for a selected operation of the most frequently occurring operations of the algorithm; and
   holding in an output register the at least one mapped functional value for the selected operation of the most frequently occurring operations of the algorithm read out of said random access memory.

17. The method of claim 16 in which said algorithm is the H.264 CABAC encode normalization process.

18. The method of claim 16 in which said input data register is a compute unit register file.

19. The method of claim 16 in which said output data register is a compute unit register file.

20. The method of claim 17 in which said input data register comprises a range number of normalization bits field, a number of outstanding bits field and a value MSB bits field.

21. The method of claim 17 in which said output register comprises a value MSB bit field, a new outstanding bits field, a number of bits to write to FIFO field, and the value of bits to write to FIFO field.

22. The method of claim 16 in which said input data register includes a plurality of fields.

23. The method of claim 16 in which said output data register includes a plurality of fields.

24. The method of claim 17 in which said random access memory look up table includes a value MSB function, a number of outstanding bits, a number of bits to write to FIFO, and the bit stream sequence.

25. The method of claim 16 in which successive addresses in said input data register are not dependent on each other.

26. The method of claim 16 in which said random access memory includes a look up table.

27. The method of claim 16 in which said algorithm is the H.264 CABAC decode process.

* * * * *

UNITED STATES PATENT AND TRADEMARK OFFICE
CERTIFICATE OF CORRECTION

PATENT NO.       : 7,650,322 B2
APPLICATION NO.  : 11/584877
DATED            : January 19, 2010
INVENTOR(S)      : Yosef Stein et al.

It is certified that error appears in the above-identified patent and that said Letters Patent is hereby corrected as shown below:

In Claim 13, column 8, line 5, delete "functions" and insert --function--.

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,650,322 B2　　　　　　　　　　　　　　　　　　　　　　Page 1 of 1
APPLICATION NO. : 11/584877
DATED : January 19, 2010
INVENTOR(S) : Stein et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 442 days.

Signed and Sealed this

Twenty-third Day of November, 2010

David J. Kappos
*Director of the United States Patent and Trademark Office*